(12) United States Patent
Ahn et al.

(10) Patent No.: US 8,629,486 B2
(45) Date of Patent: Jan. 14, 2014

(54) CMOS IMAGE SENSOR HAVING ANTI-ABSORPTION LAYER

(75) Inventors: Jung-chak Ahn, Yongin-si (KR); Eun-sub Shim, Anyang-si (KR); Bum-suk Kim, Hwaseong-si (KR); Kyung-ho Lee, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 13/171,946

(22) Filed: Jun. 29, 2011

(65) Prior Publication Data

US 2011/0316002 A1 Dec. 29, 2011

(30) Foreign Application Priority Data

Jun. 29, 2010 (KR) .......................... 10-2010-0062076
Jun. 29, 2010 (KR) .......................... 10-2010-0062077

(51) Int. Cl.
*H01L 27/146* (2006.01)

(52) U.S. Cl.
USPC ................. 257/292; 257/E27.133; 250/214 R

(58) Field of Classification Search
USPC ................. 250/214 R; 257/292, 460, E27.133
See application file for complete search history.

(56) References Cited

U.S. PATENT DOCUMENTS

| | | | |
|---|---|---|---|
| 2005/0258462 A1* | 11/2005 | Min | 257/292 |
| 2009/0200585 A1 | 8/2009 | Nozaki et al. | |
| 2010/0176276 A1* | 7/2010 | Ihara | 250/214 R |

FOREIGN PATENT DOCUMENTS

| | | |
|---|---|---|
| KR | 10-2005-0108903 A | 11/2005 |
| KR | 10-0644025 B1 | 11/2006 |
| KR | 10-2007-0056691 A | 6/2007 |

* cited by examiner

*Primary Examiner* — Thomas L Dickey
(74) *Attorney, Agent, or Firm* — Lee & Morse, P.C.

(57) ABSTRACT

A complementary metal-oxide-semiconductor (CMOS) image sensor, including a wiring layer, a photodiode stacked with the wiring layer, a micro-lens stacked on the photodiode, an anti-reflection layer stacked on the photodiode. An anti-absorption layer may be provided between the photodiode and the anti-reflection layer. The photodiode may include a first portion and a second portion. Light may be focused on the first portion by the micro-lens and the second portion may at least partially surround the first portion. A material of the first portion may have a refractive index higher than a refractive index of a material of the second portion. The anti-absorption layer may include a compound semiconductor having an energy band gap greater than an energy band gap of a semiconductor included in the photodiode.

17 Claims, 16 Drawing Sheets

CMOS IMAGE SENSOR HAVING ANTI-ABSORPTION LAYER

Korean Patent Application No. 10-2010-0062076, filed on Jun. 29, 2010, and Korean Patent Application No. 10-2010-0062077, filed on Jun. 29, 2010 in the Korean Intellectual Property Office, and entitled: "CMOS Image Sensor," are incorporated by reference herein in their entirety.

BACKGROUND

1. Field

Embodiments relate to a complementary metal-oxide-semiconductor (CMOS) image sensor, and more particularly, to a back-side illumination CMOS image sensor having an anti-absorption material formed on an interface between an anti-reflection layer (ARL) and a photodiode. Embodiments relate to a CMOS image sensor including a photodiode that includes regions having different refractive indices.

2. Description of the Related Art

CMOS image sensors convert an optical image to an electrical image. Recently, as information and communications technology has developed and digital electronic devices have become ubiquitous, CMOS image sensors having improved performance have been used in various devices such as digital cameras, camcorders, mobile phones, personal communication systems (PCSs), game machines, security cameras, and medical cameras. As the increase in integration of semiconductor products has accelerated and thus the size of a unit cell has greatly decreased, a line width in a pattern and a distance between patterns have decreased significantly. Although the size of a unit cell is reduced, electrical characteristics and low power consumption of a device should be maintained.

As the degree of integration of pixels has increased in order to achieve increased resolution for a CMOS image sensor, the volume of a photoelectric conversion element, e.g., a photodiode, per unit pixel has decreased, thereby reducing sensitivity.

SUMMARY

One or more embodiments provide a back-side illumination complementary metal-oxide-semiconductor (CMOS) image sensor including an anti-absorption layer formed on an interface between a photodiode and an anti-reflection layer.

One or more embodiments provide a CMOS image sensor for guiding light into a photodiode including regions including different refractive indices.

One or more embodiments provide a front-side CMOS image sensor and a back-side illumination CMOS image sensor for guiding light into a photodiode including regions having different refractive indices.

One or more embodiments may provide a back-side illumination complementary metal-oxide-semiconductor (CMOS) image sensor, including a wiring layer, a photodiode on the wiring layer, an anti-absorption layer on the photodiode, and an anti-reflection layer on the anti-absorption layer, wherein the anti-absorption layer includes a compound semiconductor having an energy band gap greater than an energy band gap of a semiconductor included in the photodiode.

The compound semiconductor may pass visible light therethrough.

The semiconductor may include silicon (Si).

The compound semiconductor may include silicon-carbide (SiC).

The compound semiconductor may be formed on the photodiode by deposition.

A P-type dopant with high concentration may be doped into the anti-absorption layer.

The P-type dopant may include boron (B).

The CMOS image sensor may include a color filter layer formed on the anti-reflection layer.

The CMOS image sensor may include a micro-lens formed on the color filter layer.

The wiring layer may include a plurality of metal layers and insulating layers for insulating the plurality of metal layers.

One or more embodiments may provide a complementary metal-oxide-semiconductor (CMOS) image sensor, including a micro-lens for receiving light, and a photodiode including a first portion and a second portion, wherein light is focused on the first portion by the micro-lens and the second portion at least partially surrounds the first portion, and a material of the first portion has a refractive index higher than a refractive index of a material of the second portion.

The light focused on the first portion may be totally reflected at a boundary surface between the first portion and the second portion.

The photodiode may include silicon (Si), and the material of the first portion may have a refractive index higher than a refractive index of the silicon (Si) due to doping or compound semiconductor growth.

The photodiode may include silicon (Si), and the material of the second portion may have a refractive index lower than a refractive index of the silicon due to doping or compound semiconductor growth.

The material of the first portion may include silicon-germanium (SiGe) and the material of the second portion may include silicon (Si).

The material of the first portion may include silicon (Si) and the material of the second portion may include silicon-carbide (SiC).

The first portion may be formed at a central portion of the photodiode, and the second portion may surround an upper surface, a lower surface, and side surfaces of the first portion.

The first portion may pass through the photodiode in a Z-axis direction and the second portion may surround side surfaces of the first portion.

The CMOS image sensor may be one of a back-side illumination CMOS image sensor and a front-side illumination CMOS image sensor.

One or more embodiments may provide a complementary metal-oxide-semiconductor (CMOS) image sensor, including a wiring layer, a photodiode stacked with the wiring layer, the photodiode including a first portion and a second portion, a micro-lens stacked on the photodiode, an anti-reflection layer stacked on the photodiode, and anti-absorption layer between the photodiode and the anti-reflection layer, wherein light is focused on the first portion by the micro-lens and the second portion at least partially surrounds the first portion, a material of the first portion has a refractive index higher than a refractive index of a material of the second portion, and the anti-absorption layer includes a compound semiconductor having an energy band gap greater than an energy band gap of a semiconductor included in the photodiode.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
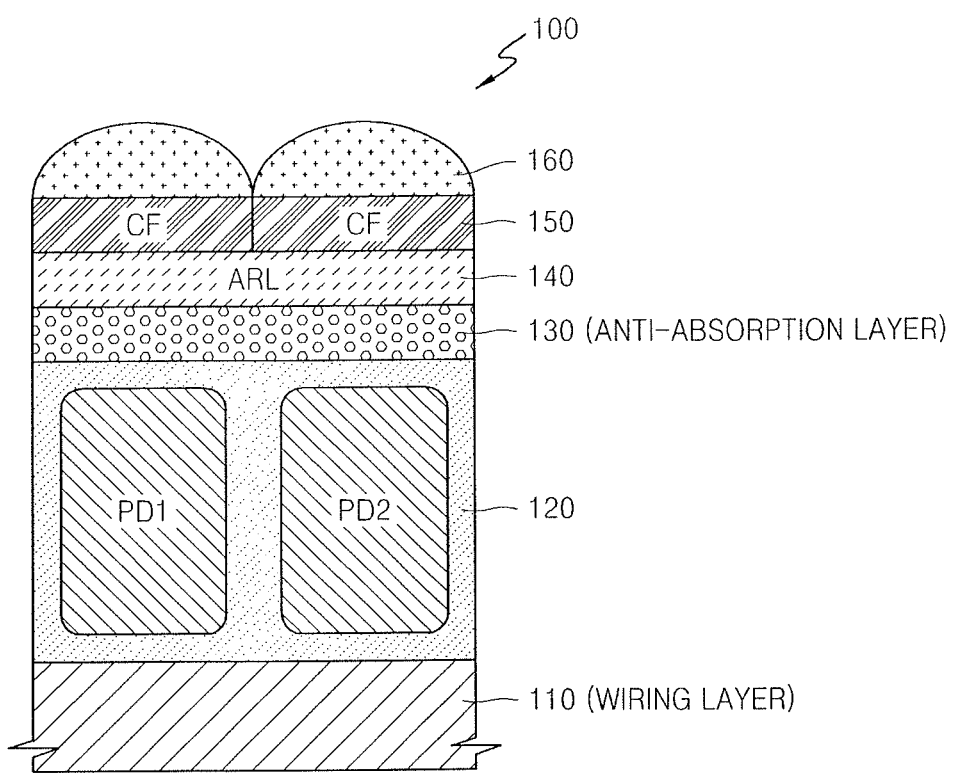
FIG. 1 illustrates a cross-sectional view of a stacked structure of an exemplary embodiment of a back-side illumination complementary metal-oxide-semiconductor (CMOS) image sensor including an anti-absorption layer formed on an interface between a photodiode layer and an anti-reflection layer (ARL)

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "on," "over," or "above" another element, it can be directly on, over, or above the other element, or intervening elements may also be present. Further, it will be understood that when an element is referred to as being "under" or "below" another element, it can be directly under or below, and one or more intervening elements may also be present. In addition, it will also be understood that when an element is referred to as being "between" two elements, it can be the only layer between the two elements, or one or more intervening elements may also be present. Like reference numerals refer to like elements throughout the specification.

One or more embodiments may provide an image sensor including an anti-absorption material without causing interface defects by using doping or compound semiconductor growth on an interface between a photodiode and an anti-reflection layer (ARL). Accordingly, in one or more embodiments, since light may be absorbed and electrons may be generated at a predetermined depth away from a surface of a back side, the surface of the back side may be rarely affected by dark defects. As a result, in one or more embodiments, while a photodiode having a high electric field may be formed, a number of white spots may not be increased.

In one or more embodiments, light may be guided into a photodiode using refraction and, more particularly, e.g., by forming regions having different refractive indices in the photodiode.

FIG. 1 illustrates a cross-sectional view of a stacked structure of an exemplary embodiment of a back-side illumination complementary metal-oxide-semiconductor (CMOS) image sensor 100.

The image sensor 100 may include a wiring layer 110, a photodiode layer 120, an anti-absorption layer 130, an anti-reflection layer (ARL) 140, a color filter 150, ad a micro-lens 160. The photodiode layer 120 may be arranged on the wiring layer 110. The anti-absorption layer 130, the ARL 140, the color filter 150, and the micro-lens 160 may be stacked on the photodiode layer 120.

The anti-absorption layer 130 may be formed at an interface between the photodiode layer 120 and the ARL 140.

In FIG. 1, two unit picture elements PD1 and PD2 are illustrated. However, embodiments are not limited thereto, e.g., the CMOS image sensor 100 may include more than two unit picture elements PD. Two photodiodes PD1, PD2 may be formed on a semiconductor substrate over the photodiode layer 120.

A photodiode and a photodiode layer will be interchangeably used hereinafter. The unit picture elements may be separated from one another by trenches (not shown), which may each be filled with an insulating material.

The photodiode layer 120 may include a semiconductor. The anti-absorption layer 130 may be stacked on the photodiode layer 120. The anti-absorption layer 130 may include a compound semiconductor. In one or more embodiments, the compound semiconductor may have an energy band gap, (e.g., if Eg(Si)=1.1 eV, ~1.3 eV or more) greater than that of the semiconductor included of the photodiode layer 120.

For example, if the semiconductor used to form the photodiode layer 120 is silicon (Si) and silicon (Si) has an energy band gap of 1.1 eV, the compound semiconductor used to form the anti-absorption layer 130 may have an energy band gap of greater than 1.3 eV. The ARL 140, a color filter 150, and a micro-lens 160 are sequentially stacked on the anti-absorption layer 130.

Referring to FIG. 1, light first reaches the photodiode layer 120. In a general CMOS image sensor, light incident on the general CMOS image sensor passes through the wiring layer 110 before being incident on the photodiode layer 120. Some differences between the back-side illumination CMOS image sensor and the general CMOS image sensor will be explained below.

In one or more embodiments, a material of the anti-absorption layer 110 may include a silicon-doped layer, etc., that absorbs light without generating interface defects. An energy band gap Eg of the compound semiconductor of the anti-absorption layer 130 may be greater than an energy band gap of the semiconductor of the photodiode layer 120. For example, if the semiconductor of the photodiode layer 120 is silicon (Si), the compound semiconductor of the anti-absorption layer 130 may include any material having an energy gap greater than that of silicon (Si). More particularly, e.g., the compound semiconductor of the anti-absorption layer 130 may be silicon-carbide (SiC).

An optical principle of one or more embodiments will be explained below. Only one unit picture element will be employed in the explanation for convenience of explanation.

In a back-side illumination structure, many defects, which may result in white spots and dark current, may be generated at an interface between an anti-reflection layer and a photodiode layer if, e.g., an anti-absorption layer, e.g., 130 of FIG. 1, is not provided therebetween. More particularly, without, e.g., the anti-absorption layer 130, the anti-reflection layer and the photodiode layer including silicon (Si), may result in leakage and may cause electrons to be generated on a surface of a back side.

Further, light incident on the back-side illumination structure may be subjected to photoelectric conversion mainly on the surface of the back side. In order to reduce crosstalk by which electrons generated on the surface move to a neighboring picture element, the photodiode layer may have a strong electric field. However, if the photodiode layer has a strong electric field, since the electrons generated by the defects are also attracted to the photodiode layer 120, white spots and crosstalk are in a tradeoff relationship. That is, while a strong electric field may reduce crosstalk, the strong electric field may increase white spots as a result of the electrons generated by the defects.

Figure 2:
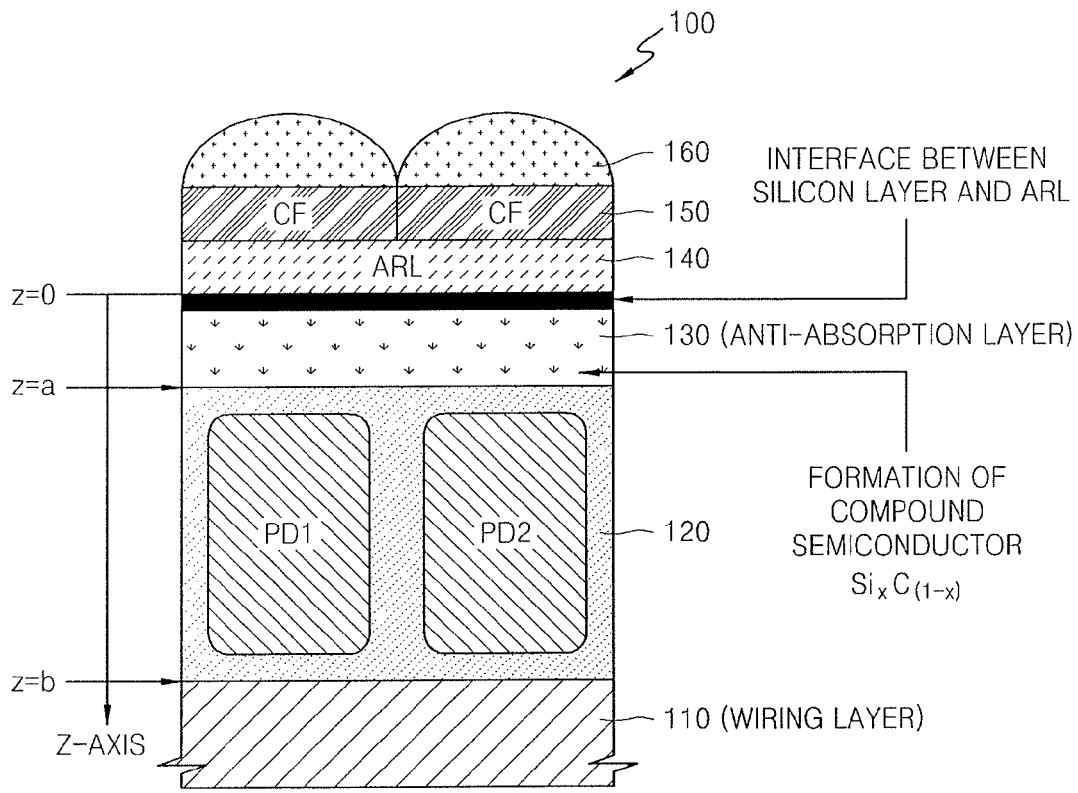
FIG. 2 illustrates another exemplary cross-sectional view of the stacked structure of back-side illumination CMOS image sensor of FIG. 1, further illustrating an interface between the anti-absorption layer and the anti-reflection layer.

Referring to FIGS. 1 and 2, one or more embodiments provide a structure for reducing the effect of defects without increasing electrical crosstalk by, e.g., providing the anti-absorption layer 130.

FIG. 2 illustrates another exemplary cross-sectional view of the stacked structure of back-side illumination CMOS image sensor 100 of FIG. 1, further illustrating an interface between the anti-absorption layer 130 and the AFL 140. That is, the stacked structure of back-side illumination CMOS image sensor 300 of FIG. 3 is the same as the stacked structure of back-side illumination CMOS image sensor 100 of FIG. 1. However, the interface between the ARL 140 and the photodiode layer 120 formed of silicon (Si) is marked with dark color.

For convenience of explanation, a silicon layer is employed as the photodiode layer 120 and a silicon-carbide (SiC) layer is employed as the anti-absorption layer 130. Embodiments are not limited thereto. For example, the compound semiconductor of the anti-absorption layer 130 may include any material having an energy gap greater than that of silicon (Si).

Referring to FIG. 2, the anti-absorption layer 130 may correspond to a compound semiconductor $Si_xC(1-x)$, where (x) is a ratio of silicon (Si) to carbide (C), formed at an interface (z=0) between the silicon layer (the photodiode layer 120) and the ARL 140. Since silicon-carbide (SiC) has a wide band gap, and thus, passes visible light therethrough, the compound semiconductor $Si_xC(1-x)$ may not absorb light.

In one or more embodiments, the compound semiconductor $Si_xC(1-x)$ may be formed to a thickness of several micrometers (um) or less at the interface (z=0) between the photodiode layer 120, e.g., the silicon layer, and the ARL 140.

In one or more embodiments, defects may be further reduced and/or minimized by forming, e.g., the silicon-carbide layer in such a manner that a concentration of carbon in silicon-carbide (SiC) varies within the anti-absorption layer 130.

In one or more embodiments, since there is a predetermined distance from the interface (z=0) between the silicon layer and the ARL, the effect of defects may be minimized In one or more embodiments, since no electrons may be generated in the silicon-carbide layer, crosstalk may not be increased even though a doping concentration or a depth of a P+-type layer is reduced within a predetermined range.

FIGS. 3A, 3B, 3C, and 3D illustrate graphs of relationships between a ratio of silicon (x), an energy band gap (Eg), a visible light absorptance, and a defect density and a Z-axis depth of the unit picture element of FIG. 3, respectively.

FIGS. 3A through 3D are graphs illustrating relationships between a ratio of silicon x, an energy band gap, a visible light absorptance (fraction of light absorbed at a respective wavelength), and a defect density and a z-axis depth of the unit picture element 300 of FIG. 2, respectively.

Referring to FIGS. 2, and 3A through 3D, a section from z=0 to z=a corresponds to a section in which the anti-absorption layer 130 is formed to a predetermined distance (z=a) from the interface (z=0) between the silicon layer and the ARL 140. A section from z=a to z=b corresponds to a section in which the photodiode layer 120 is formed. In one or more embodiments, e.g., 'b' may be equal to or less than 50 nm and equal to or greater than 3 um, and 'a' may be equal to or greater than 1 um and equal to or less than 20 um. In one or more embodiments, 'a' may be less than 'b'.

Figure 3A:
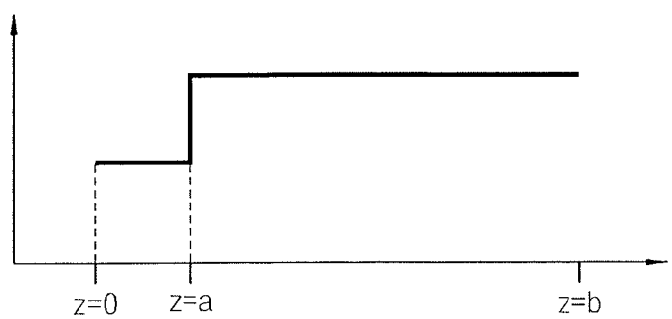
FIGS. 3A, 3B, 3C, and 3D illustrate graphs of relationships between a ratio of silicon (Si), an energy band gap, a visible light absorptance, and a defect density and a Z-axis depth of the unit picture element of FIG. 3, respectively.

Referring to FIG. 3A, in the section (z=0 to z=a) corresponding to the anti-absorption layer 130, the ratio of silicon (x) may be about 0.5, and in the section (z=a to z=b) corresponding to the photodiode layer 120, the ratio of silicon (x) may be 1.

Figure 3B:

Next, referring to FIG. 3B, in the section (z=0 to z=a) in which the anti-absorption layer 130 is formed, an energy band gap of silicon-carbide (SiC) is greater than that of silicon (Si).

Accordingly, referring to FIG. 3B, since silicon-carbide (SiC) has a wider energy band gap, silicon-carbide (SiC) is not excited by light in a visible light range.

In order for light to be absorbed by a semiconductor, in other words, in order for electrons to be excited by photon energy, photons having energy greater than a band gap are needed. Meanwhile, a relationship between a wavelength (unit is micrometers) and photon energy (unit is eV) is shown in Equation 1.

$$\lambda = hc/E \approx 1.24/E \qquad \text{[Equation 1]}$$

In Equation 1, the visible light range is generally from 400 nm to 700 nm. Photon energy is 3.1 eV at 400 nm, which may correspond to the highest energy. Since a band gap of silicon-carbide (SiC) may be higher than 3.1 eV, electrons are not excited by light in the visible light range and incident photons pass through silicon-carbide (SiC) as they are. Meanwhile, if the photodiode layer 120 is formed of silicon (Si) having a band gap of about 1.1 eV, since the band gap of about 1.1 eV is less than photon energy that is 1.77 eV at 700 nm, which may correspond to the lowest energy, electrons may be excited by light in the visible light range.

Figure 3C:
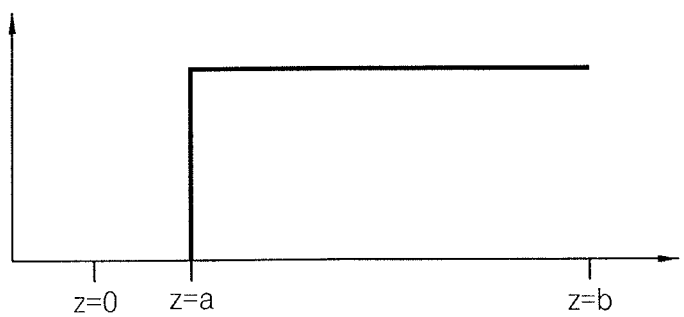
Figure 3D:
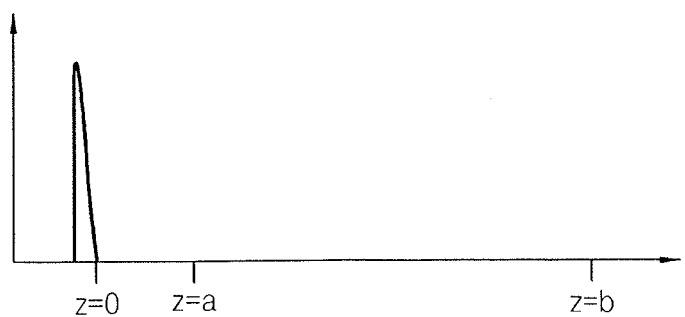

As a result, referring to FIGS. 3C and 3D, in one or more embodiments, since electrons are excited by light in a visible light range at a predetermined depth (z=a) away from a surface of a back side, e.g., not at the interface and not by the insulating layer (z=0 to z=a), the effect of dark defects on the surface of the back side may be reduced.

FIGS. 4A, 4B, 4C, 4D, 4E, and 4F illustrate cross-sectional views of resulting stacked structures during stages of an exemplary embodiment of a method of forming a back-side illumination CMOS image sensor 100 of FIG. 1. Embodiments are not limited thereto.

Figure 4A:
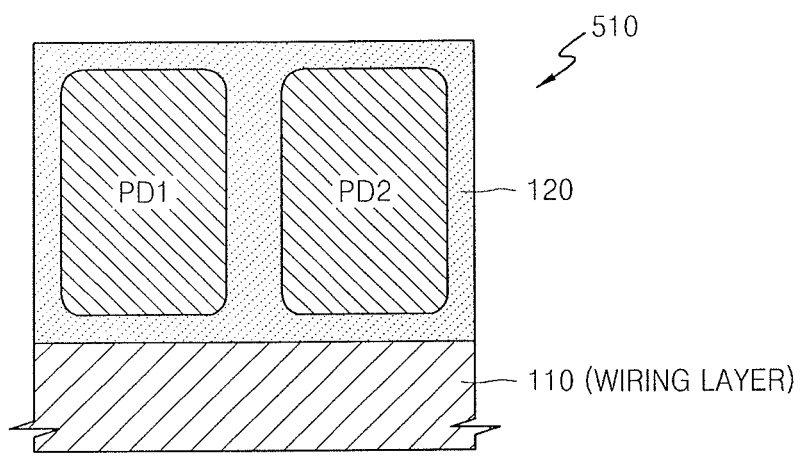
FIGS. 4A, 4B, 4C, 4D, 4E, and 4F illustrate cross-sectional views of resulting stacked structures during stages of a method of forming a back-side illumination CMOS image sensor when the photodiode layer is formed.

FIG. 4A illustrates a cross-sectional view of a stacked structure of an intermediate stage back-side illumination CMOS image sensor 510 after the wiring layer 110 and the photodiode layer 120 are formed.

More particularly, e.g., one or more photodiodes PD1 and PD2 and MOS transistors may be formed on one surface of a wafer through a series of processes, and metals for electrically connecting the photodiode and the MOS transistors may be completely formed. It is assumed that a face of the wafer where the photodiode and the MOS transistors are formed is a top face of the wafer. From among a plurality of layers included in the back-side illumination CMOS image sensor of FIG. 1, the exemplary method may include forming the photodiodes PD1 and PD2 and the wiring layer 110.

After processing of the photodiodes PD1 and PD2 and the wiring layer 110 are completed, a bottom face of the wafer may be ground to a predetermined thickness and the wafer may be turned upside down. When the wafer is turned upside down, the substrate that was originally located at the bottom, is facing upwards. The stacked structure of back-side illumination CMOS image sensor 510 of FIG. 4A may correspond to the upside down wafer on which the photodiodes PD1 and PD2 and the MOS transistors are formed.

Accordingly, the photodiodes PD1 and PD2, which were on the bottom during the previous process, are facing upwards, and the wiring layer 110, which was on the top, e.g., uppermost, during the previous process, is facing downwards. A substrate on which an electrode of the photodiode PD1, PD2 is formed may be ground after the photodiode and the transistors are all formed, to adjust a width of one terminal of the photodiode PD1, PD2.

The anti-absorption layer 130, the anti-reflection layer 140, the color filter 150, and the micro-lens 160 may be formed on the ground face of the wafer. A subsequent process will be explained with reference to FIGS. 4B through 4F.

Figure 4B:
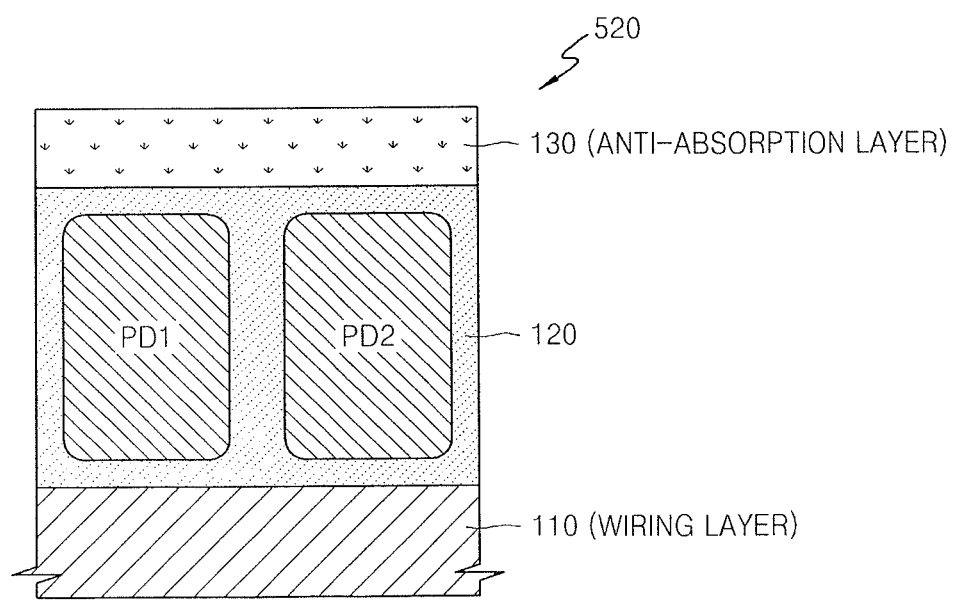

FIG. 4B illustrates a cross-sectional view of an intermediate stage of a stacked structure of a back-side illumination CMOS image sensor 520 after the anti-absorption layer 130 having a predetermined shape is formed on the photodiode layer 120. The anti-absorption layer 130 may be formed using, e.g., doping or deposition. The anti-absorption layer 130 may be formed on the photodiode layer 120 before formation of the ARL 140 so as to be an interface between the ARL 140 and the silicon layer, e.g., the photodiode layer 120.

Figure 4C:
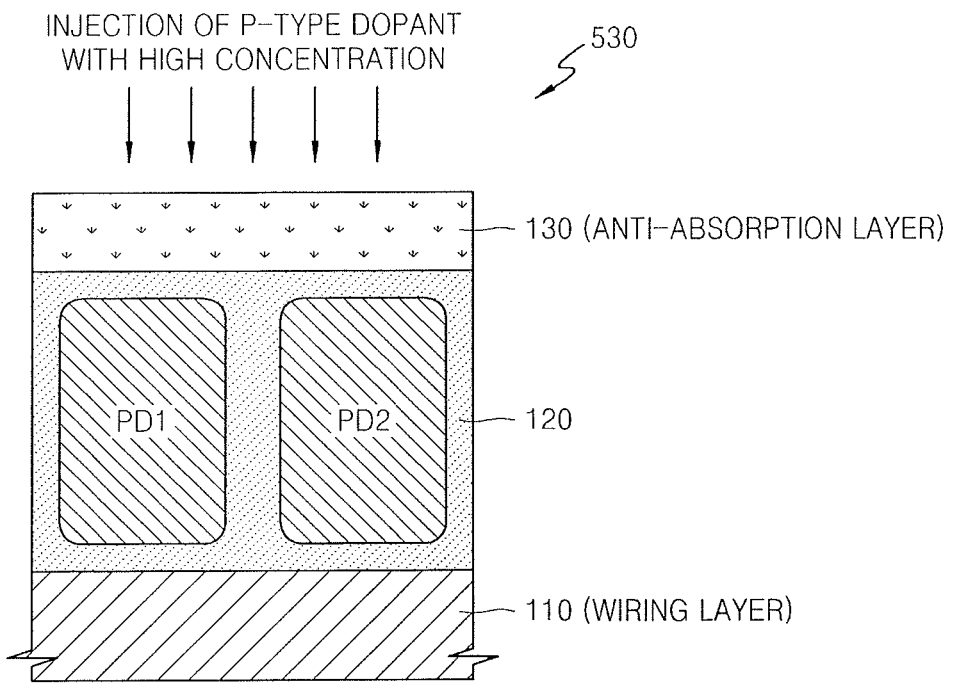

FIG. 4C illustrates a cross-sectional view of an intermediate stage of a stacked structure of back-side illumination CMOS image sensor 530 when a P-type dopant with a relatively high concentration is injected into the anti-absorption layer 130. Referring to FIG. 4C, although the anti-absorption layer 130 is illustrated as being formed by injecting a P-type high dopant through ion implantation, embodiments are not limited thereto.

For example, in one or more embodiments, the compound semiconductor of the anti-absorption layer 130 may include a P-type dopant with a relatively high concentration. In one or more other embodiments, e.g., the injection of the P-type dopant with high concentration may be omitted, i.e., after formation of the anti-absorption layer 130 of FIG. 4B, processing may proceed to FIG. 4D.

The P-type dopant with high concentration may include, e.g., boron (B). The P-type dopant with high concentration may be injected because as a result of the P-type dopant with high concentration, a minority carrier may be reduced to suppress dark current.

In general, if a boron-doped layer is formed without a material for absorbing light between a photodiode and an ARL, electron-hole pairs are generated, and thus, sensitivity may be reduced and/or crosstalk may be increased.

In one or more embodiments, by doping the compound semiconductor of the anti-absorption layer 130 that absorbs little and/or no light with a P-type dopant of a high concentration, light sensitivity may be maintained, e.g., not reduced, and the effect of defects or surface leakage may be reduced.

Figure 4D:
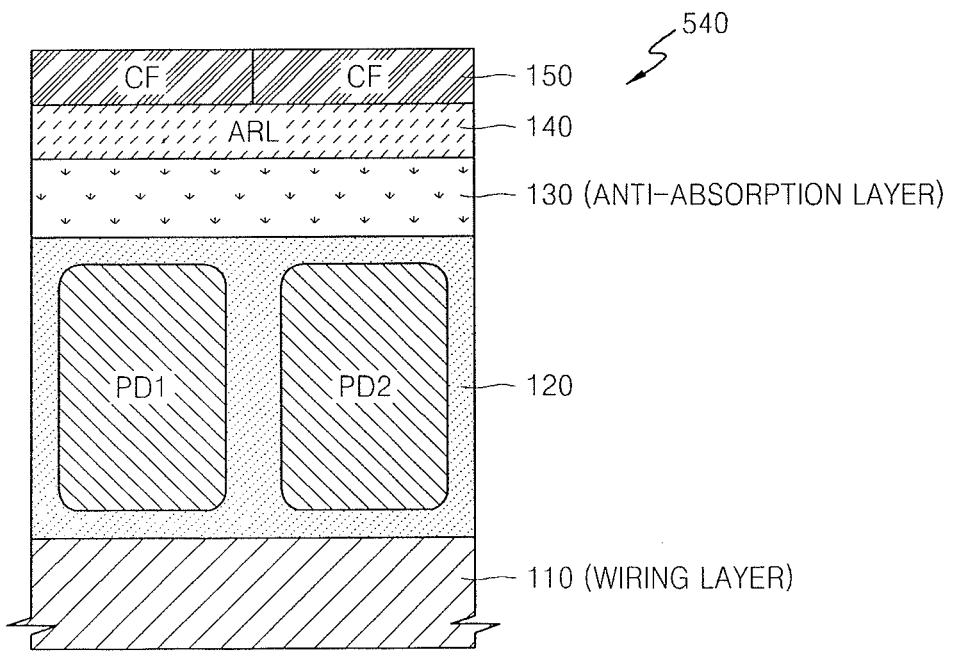

FIG. 4D illustrates a cross-sectional view of an intermediate stage of a stacked structure of a back-side illumination CMOS image sensor 540 after the ARL 140 and the color filter layer 150 are sequentially stacked on the anti-absorption layer 130.

Figure 4E:
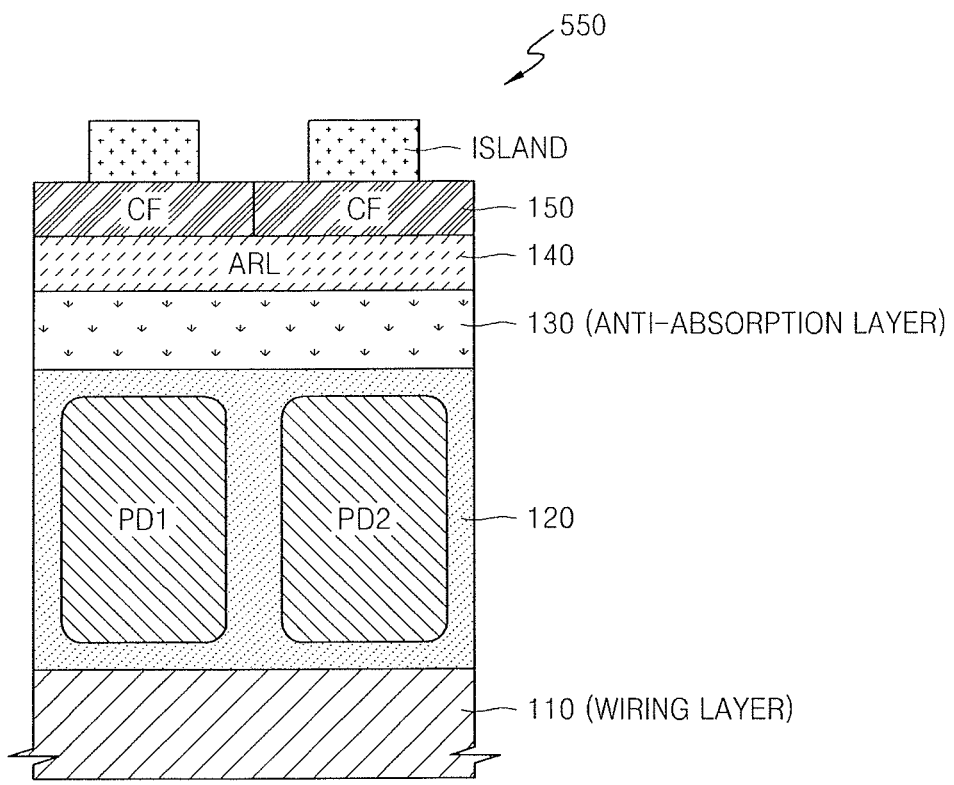

FIG. 4E illustrates a cross-sectional view of an intermediate stage of a stacked structure of a back-side illumination CMOS image sensor 550 after islands each having a predetermined shape are formed over the photodiode layer 120. The islands may be formed over the photodiodes PD1 and PD2, as illustrated in FIG. 4E, respectively. While FIG. 4E illustrates the islands as being smaller than the photodiodes, in one or more other embodiments, the islands may have sizes greater than those of the photodiodes PD1 and PD2. In one or more embodiments, one or more of the islands may be formed for each unit pixel, and sizes of the islands may vary according to a selected subsequent process.

Referring to FIG. 4E, e.g., in one or more embodiments, one island may be formed for each of the plurality of unit picture elements. The predetermined shape of the islands may be scaled down by a certain ratio from a shape defined by the respective photodiode. For example, if the photodiode has a rectangular shape, the island may have a rectangular shape, and if the photodiode has a hexagonal or octagonal shape, the island may have a hexagonal or octagonal shape. Embodiments are not limited thereto, e.g., the island may have a circular shape.

An exemplary method of forming the islands will be explained. While the exemplary method is described below, embodiments are not limited thereto and the islands may be formed according to other methods.

More particularly, to form the islands, a material used to form a micro-lens for refracting photons may be coated. A mask for defining an island may then be prepared. The island may be defined in a photoresist using the mask. A portion of the photoresist other than a portion defined as the island may be removed. The island may be completely formed using an etchant to etch a material used to form the island.

Figure 4F:
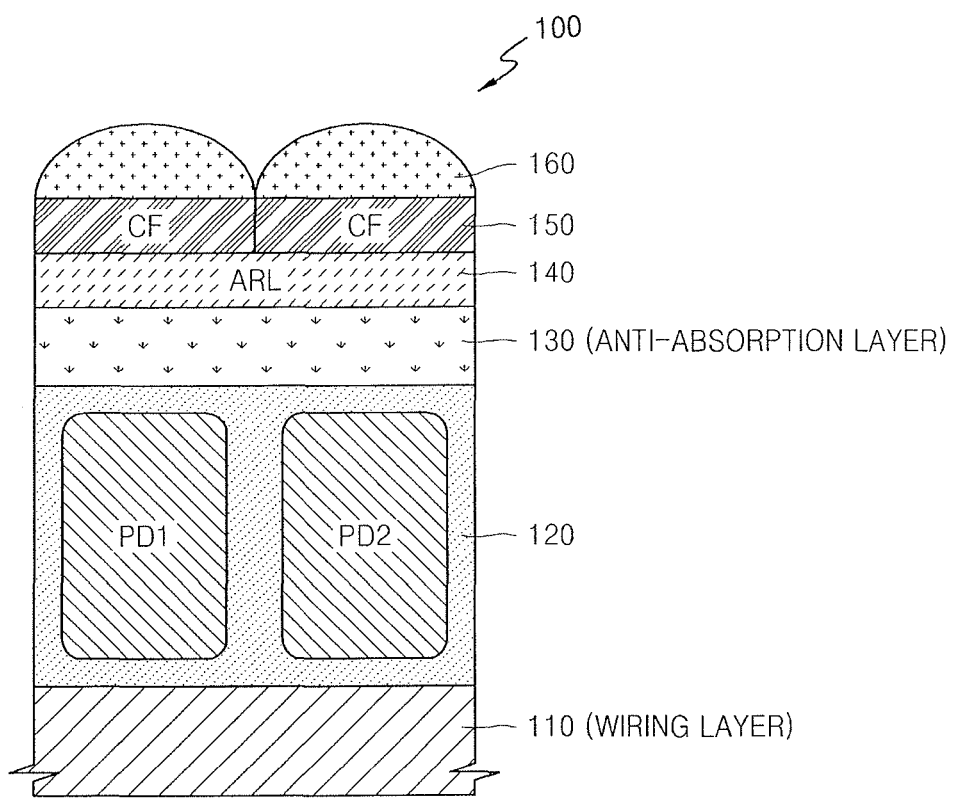

FIG. 4F illustrates a cross-sectional view of a stacked structure of a back-side illumination CMOS image sensor 560 after the micro-lens 160 is formed. The micro-lens 160 may be formed by applying heat to the islands formed over the photodiode layer 120. The CMOS image sensor 560 corresponds to the CMOS image sensor 100 of FIG. 1.

In one or more embodiments, light may be guided into a photodiode using refraction and, more particularly, e.g., by forming regions having different refractive indices in the photodiode PD1, PD2. In detail, in the photodiode PD, a material of a predetermined region on which light is focused by a micro-lens has a refractive index higher than that of a material of a region around the predetermined region.

In general, since a dielectric constant is proportional to the square of a refractive index, the phrase "increasing a refractive index" has the same meaning as the phrase "increasing a dielectric constant" herein. Accordingly, photons, which represent light, are refracted to a central portion of a corresponding photodiode, and are focused on the central portion of the corresponding photodiode, i.e., do not move to a neighboring photodiode. In one or more embodiments, most and/or all incident photons may be refracted and focused on the central portion of the corresponding photodiode, and accordingly, photons may rarely and/or never be focused on the vicinity of the photodiode, e.g., neighboring photodiode.

For reference, photons focused on the vicinity of the neighboring photodiode may be transferred to the neighboring photodiode and such transferred photons may also be incorporated into an electrical signal corresponding to the neighboring photodiode, thereby causing crosstalk. Once such crosstalk occurs, a correct image signal may not be generated.

One or more embodiments may employ one or more photodiodes, which may each include regions having different refractive indices, such that photons may rarely be focused on the vicinity of the neighboring photodiode, and crosstalk can be reduced and/or eliminated.

Figure 5A:
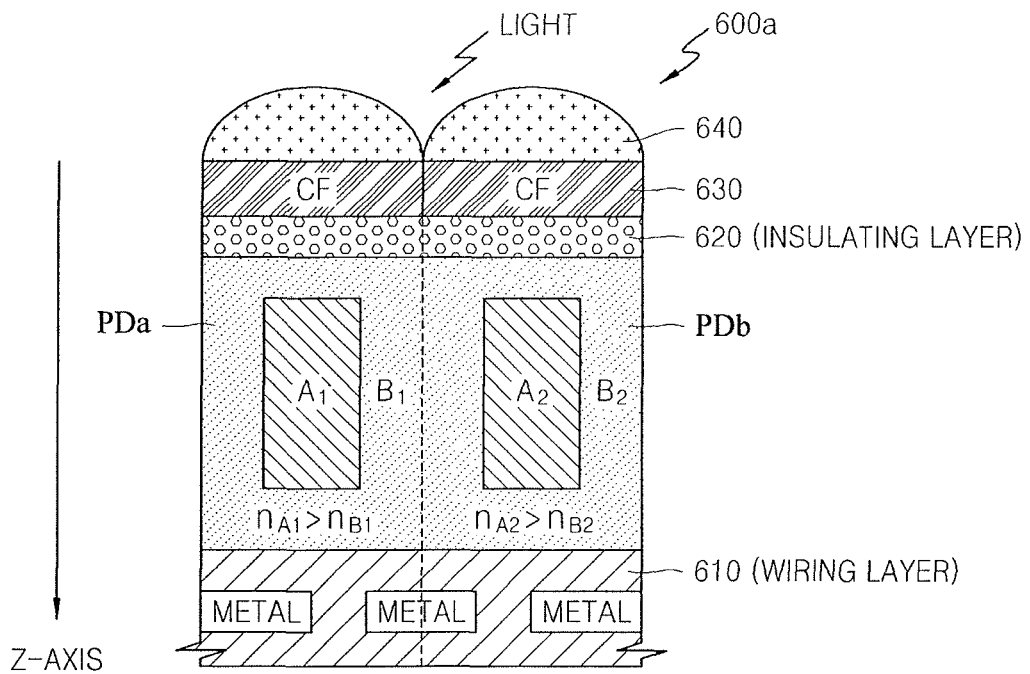
FIGS. 5A and 5B illustrate cross-sectional views of exemplary embodiments of stacked structures of back-side illumination complementary metal-oxide-semiconductor (CMOS) image sensors.
Figure 5B:
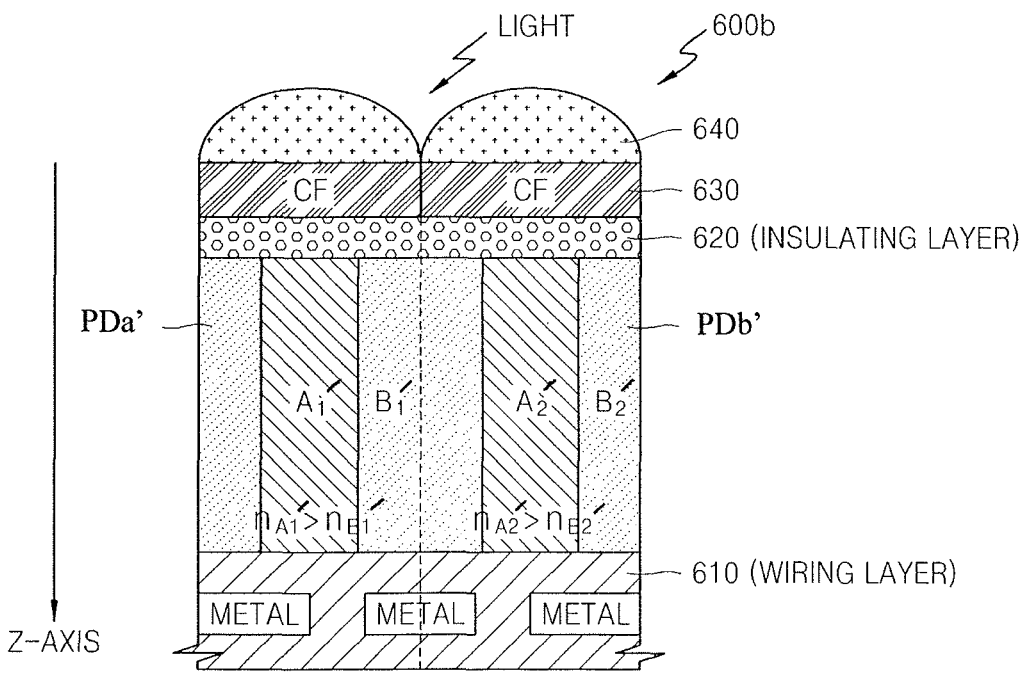

FIGS. 5A and 5B illustrate cross-sectional views of stacked structures of other exemplary embodiments of back-side illumination complementary metal-oxide-semiconductor (CMOS) image sensors 600a and 600b. In general, only differences between the exemplary embodiments of FIGS. 5A and 5B and the exemplary embodiment of FIG. 1

In FIG. 5A, two unit pixels are illustrated. Embodiments are not limited thereto. For example, the back-side illumination complementary CMOS image sensor 600 may include more than two unit pixels.

Referring to FIG. 5A, a wiring layer 610 may be formed at a bottom of the back-side illumination CMOS image sensor 600a. The wiring layer 610 may include a plurality of metal layers and insulating film layers that insulate the plurality of metal layers.

Photodiodes PDa and PDb may be formed on a semiconductor substrate over the wiring layer 610. The photodiodes PDa and PDb may be optically divided into first portions A1 and A2 and second portions B1 and B2, respectively. Embodiments are not limited to two portions having different refractive indices, e.g., may include more than two portions having different refractive indices.

Referring to FIG. 5A, electrically, in the case of electron carriers, if the semiconductor substrate is a P-type semiconductor substrate, the photodiodes PDa and PDb formed on the semiconductor substrate may be N-type photodiodes, and in the case of hole carriers, if the semiconductor substrate is an N-type semiconductor substrate, the photodiodes PDa and PDb formed on the semiconductor substrate may be P-type photodiodes.

Referring still to FIG. 5A, the first portions $A_1$ and $A_2$ may include at least a portion on which light is focused by a micro-lens 640. The second portions $B_1$ and $B_2$ surround the first portions $A_1$ and $A_2$. A material constituting the first portions $A_1$ and $A_2$ may have a refractive index higher than that of a material constituting the respective second portions $B_1$ and $B_2$.

For example, the material constituting the first portions $A_1$ and $A_2$ may be silicon (Si) and the material constituting the second portions $B_1$ and $B_2$ may be silicon-carbide (SiC). In general, Si has a refractive index of about 3.5, and silicon-carbide has a refractive index of about 2.6. Alternatively, e.g., the material constituting the first portions $A_1$ and $A_2$ may be silicon-germanium (SiGe) and the material constituting the second portions $B_1$ and $B_2$ may be Si.

An insulating layer 620, a color filter 630, and the micro-lens 640 may be sequentially stacked on the photodiodes PDa and PDb. The insulating layer 620 may include oxide. The photodiodes PDa and PDb may be isolated from each other by an isolating material ISO/TRAN.

Although in FIG. 5A, the first portions $A_1$ and $A_2$ are illustrated as rectangular in shape, embodiments are not limited thereto. Although in FIG. 5A, the second portions $B_1$ and $B_2$ are illustrated as surrounding upper surfaces, lower surfaces, and side surfaces of the first portions $A_1$ and $A_2$, embodiments are not limited thereto.

For example, referring to FIG. 5B, the stacked structure of FIG. 5B is the same as the stacked structure of FIG. 5A except that optical structures of photodiodes PDa' and PDb' are different. In the exemplary embodiment of FIG. 5B, first portions $A_1'$ and $A_2'$ are formed to pass through the photodiodes PD1 and PD2 in a Z-axis direction, and second portions $B_1'$ and $B_2'$ are formed to surround side surfaces of the first portions $A_1'$ $_{and\ A2}'$. In one or more embodiments, the second portions $B_1'$ and $B_2'$ may be formed to surround side surfaces and lower surfaces of the first portions $A_1'$ and $A_2'$, or side surfaces and upper surfaces of the first portions $A_1$ and $A_2$.

Figure 6A:
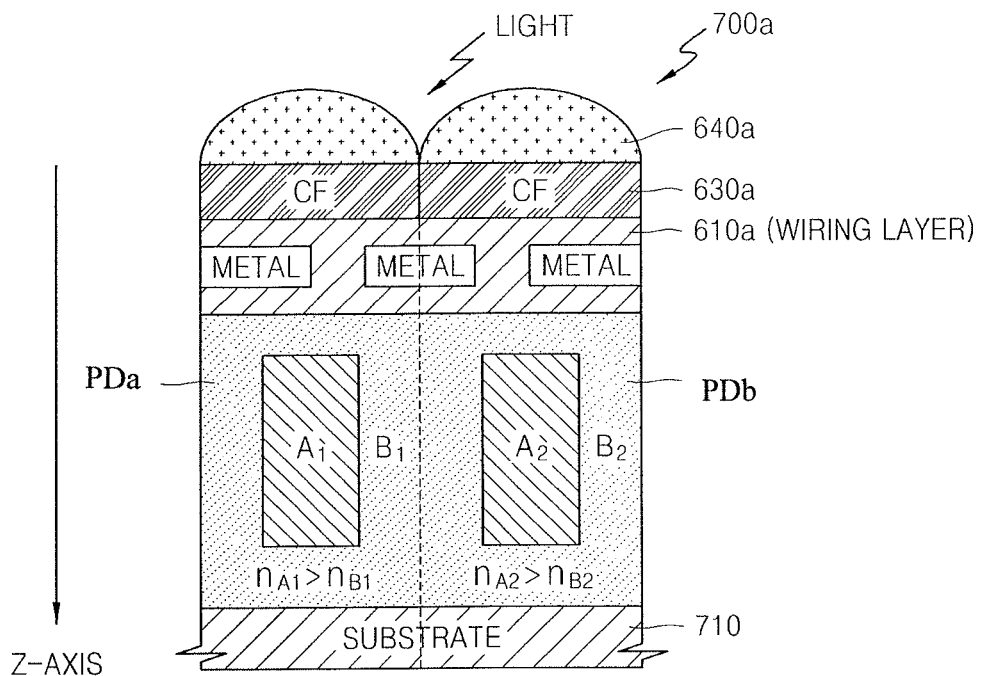
FIGS. 6A and 6B illustrate cross-sectional views of other exemplary embodiments of stacked structures of back-side illumination complementary metal-oxide-semiconductor (CMOS) image sensors.
Figure 6B:
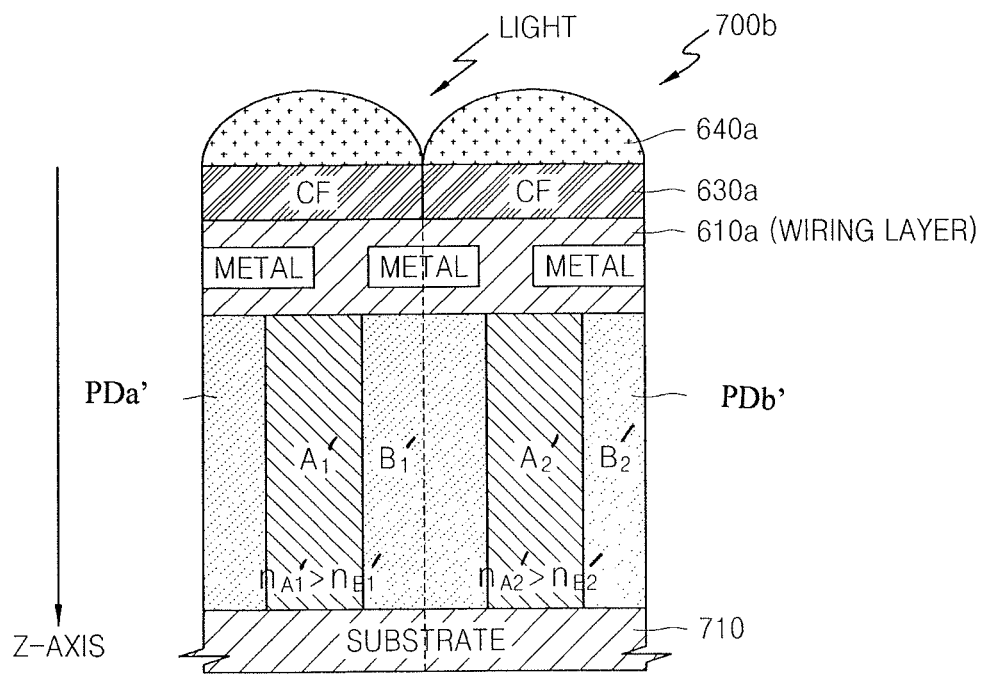

FIGS. 6A and 6B illustrate cross-sectional views of exemplary embodiments of stacked structures of front-side illumination CMOS image sensors 700A and 700B. In general, only differences between the exemplary embodiments of FIGS. 6A and 6B and those of FIGS. 5A and 5B will be described below.

In FIG. 6A, two unit pixels constituting the front-side illumination CMOS image sensor 700a are shown. However, embodiments are not limited thereto, e.g., the front-side illumination CMOS image sensor 700z may include more than two unit pixels. A semiconductor substrate 710 may be formed at a bottom of the CMOS image sensor 700a. The photodiodes PDa and PDb may be formed on the semiconductor substrate 710. The photodiodes PDa and PDb may be optically divided into first portions $A_1$ and $A_2$ and second portions $B_1$ and $B_2$, respectively. The first portions $A_1$ and $A_2$ may include at least a portion on which light is focused by a micro-lens 640a. The second portions $B_1$ and $B_2$ may surround the first portions $A_1$ and $A_2$. A material constituting the first portions $A_1$ and $A_2$ may have a refractive index higher than that of a material constituting the second portions $B_1$ and $B_2$. For example, the material constituting the first portions $A_1$ and $A_2$ may be Si and the material constituting the second portions $B_1$ and $B_2$ may be SiC. Alternatively, the material constituting the first portions $A_1$ and $A_2$ may be SiGe, and the material constituting the second portions $B_1$ and $B_2$ may be Si. In general, SiGe has a refractive index higher than 3.6. A wiring layer 610a, a color filter 630a, and the micro-lens 640a may be sequentially stacked on the photodiodes PDa and PDb. The photodiodes PD1 and PDb may be isolated from each other by an isolating material ISO/TRANS (not shown).

Although, in FIG. 6A, the first portions $A_1$ and $A_2$ are illustrated as being rectangular, embodiments are not limited thereto. Although, in FIG. 6B, the second portions $B_1$ and $B_2$ are illustrated as surrounding upper surfaces, lower surfaces, and side surfaces of the first portions $A_1$ and $A_2$, embodiments are not limited thereto.

For example, referring to FIG. 6B, an exemplary stacked structure of FIG. 6B is the same as the stacked structure of FIG. 6A except that optical structures of the photodiodes PDa' and PDb' are different. More particularly, similar to the exemplary structure of FIG. 5B, the first portions $A_1'$ and $A_2'$ may be formed to pass through the photodiodes PDa' and PDb' in a Z-axis direction, and the second portions $B_1'$ $_{and\ B2}'$ may be formed to surround side surfaces of the first portions $A_1'$ and $A_2'$. Alternatively, e.g., the second portions $B_1'$ and $B_2'$ may be formed to surround side surfaces and lower surfaces of the first portions $A_1'$ and $A_2'$, or side surfaces and upper surfaces of the first portions $A_1'$ and $A_2'$.

In general, a CMOS image sensor may include a plurality of unit pixels and may convert an image signal sensed by each of the plurality of unit pixels into an electrical signal. Each of the plurality of unit pixels may include a photodiode for sensing an image signal incident thereon and a plurality of MOS transistors for converting the image signal sensed by the photodiode into an electrical signal.

Some of the differences between the back-side illumination CMOS image sensors 600a and 600b of FIGS. 5A and 5B and the front-side illumination CMOS image sensors 700a and 700b of FIGS. 6A and 6B will now be explained.

The back-side illumination CMOS image sensors 600a and 600b of FIGS. 5A and 5B are configured to receive light from a bottom face of a chip (i.e., the semiconductor substrate), rather than from a top face of the chip. That is, each of the back-side illumination CMOS image sensors 600a and 600b is formed by forming a photodiode and MOS transistors constituting the image sensor, grinding a lower portion of the chip to a thickness most suitable for receiving light, and forming the color filter 630 and the micro-lens 640 under the ground lower portion. Since the back-side illumination CMOS image sensors 600a and 600b of FIGS. 5A and 5B have such a back-side illumination configuration and are configured such that the first portions $A_1$ and $A_2$ have a refractive index higher than that of the second portions $B_1$ and $B_2$, respectively, light may be prevented from moving to a neighboring photodiode, and crosstalk may be reduced and/or eliminated.

The front-side illumination CMOS image sensors 700a and 700b of FIGS. 6A and 6B are configured to receive an image signal, that is, light, from a top face of a chip on which a photodiode and MOS transistors are formed. Since the MOS transistors as well as the photodiode are formed in a unit pixel, a light-receiving area of the photodiode may correspond to a part of the unit pixel on the top face of the chip.

Since the front-side illumination CMOS image sensors 700a and 700b of FIGS. 6A and 6B have such a front-side illumination configuration and are configured such that the first portions $A_1$ and $A_2$ have a refractive index higher than that of the second portions $B_1$ and $B_2$, respectively, light may be prevented from moving to a neighboring photodiode, thereby avoiding crosstalk.

An optical principle of one or more embodiments will now be explained.

Figure 7:
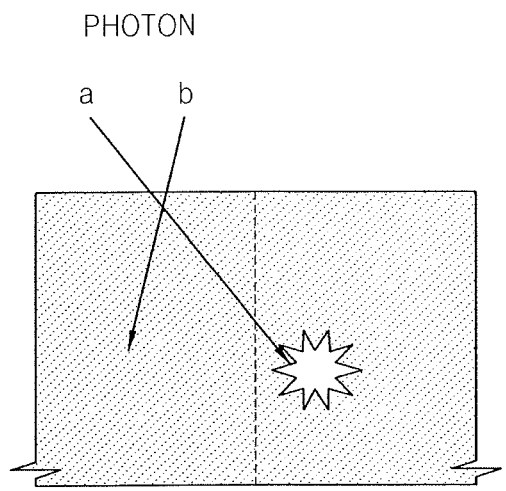
FIG. 7 illustrates a cross-sectional view of photodiodes each not including regions having different refractive indices.

FIG. 7 illustrates a cross-sectional view of photodiodes PD1 and PD2 each not including regions having different refractive indices.

If light is represented by photons, two photons "a" and "b" are incident on one photodiode PD1 in FIG. 7. Although the light may be incident on another photodiode PD2, the light is incident on only one photodiode PD1 in FIG. 7 for convenience of explanation. For example, it is assumed that the photon "a" of the two photons "a" and "b" is red light, and the other photon "b" is blue light. In general, a great number of photons may be used to generate electron-hole pairs in a photodiode region. However, from among red, green, and blue lights, a penetration depth of the blue light is the shortest, and a penetration depth of the red light is the longest.

The red light having the longest penetration depth may move to a neighboring photodiode when photons are converted into an electrical signal later. Accordingly, noise or optical crosstalk may occur in the neighboring photodiode.

Further, the demand for a CMOS image sensor on which a highly integrated and low mobile communication unit may be mounted has increased in recent years. However, the size of a unit pixel used in such a low power color image sensor is reduced to about half.

As the size of the unit pixel is reduced, it is important to prevent and/or reduce signal distortion. More particularly, e.g., it is important to prevent and/or reduce signal distortion with respect to a blue pixel and a green pixel due to the red light having the longest penetration depth and electrical interference between adjacent pixels.

Figure 8:
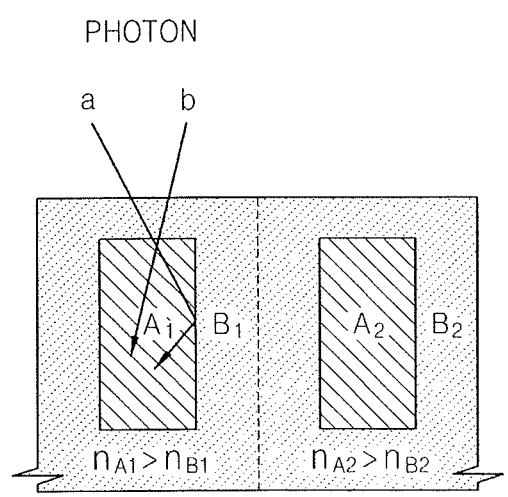
FIG. 8 illustrates a cross-sectional view of exemplary embodiments of photodiodes each including regions having different refractive indices.

FIG. 8 illustrate a cross-sectional view of photodiodes PDa and PDb, each including regions having different refractive indices.

In the exemplary embodiment of FIG. 8, two media having different refractive indices exist in the photodiodes PDa and PDb. That is, e.g., the first portions $A_1$ and $A_2$ each formed of a material having a relatively high refractive index and second portions $B_1$ and $B_2$ formed of a material having a relatively low refractive index are provided. For a clearer comparison between the photodiodes of FIG. 7 and the photodiodes PDa and PDb of FIG. 8, a relationship between one photodiode and a neighboring photodiode will be explained on the assumption that the one photodiode is the photodiode PDa and the other photodiode is the photodiode PDb.

According to Snell's law, when two media having different refractive indices $n_1$ and $n_2$ contact each other, since the speed of light varies as it moves from one medium to the other medium, the light is bent. The angles of incidence and refraction are $\theta_1$ and $\theta_2$. In this case, Snell's law is defined as follows.

$$\frac{\sin\theta_1}{\sin\theta_2} = \frac{v_1}{v_2} = \frac{n_2}{n_1} \text{ or } n_1\sin\theta_1 = n_2\sin\theta_2$$

Based on Snell's law, referring back to FIG. 8, when a material having a refractive index that is higher than that of the second portion $B_1$ constitutes the first portion $A_1$ including a portion on which light is focused by a micro-lens, photons "a" and "b" focused on the first portion $A_1$ do not move to the second portion $B_1$, and light is refracted to the first portion $A_1$ having the higher refractive index.

Furthermore, when moving from the first portion $A_1$ formed of an optically dense medium to the second portion $B_1$ formed of an optically sparse medium, photons incident at an angle greater than a specific threshold angle may be totally reflected without being refracted.

Such a phenomenon results from Snell's law. One or more embodiments of a CMOS including one or more features described herein based, e.g., on Snell's law, may reduce optical crosstalk by enabling photons having a large wavelength to be refracted and reflected without passing through a boundary line between the first portion A1 and the second portion B1 having different refractive indices, such that relatively no or fewer photons move to the neighboring photodiode PD2.

An exemplary embodiment of a method of forming a back-side illumination CMOS image sensor including a photodiode that includes regions having different refractive indices will now be explained. Embodiments are not, however, limited thereto.

Figure 9:
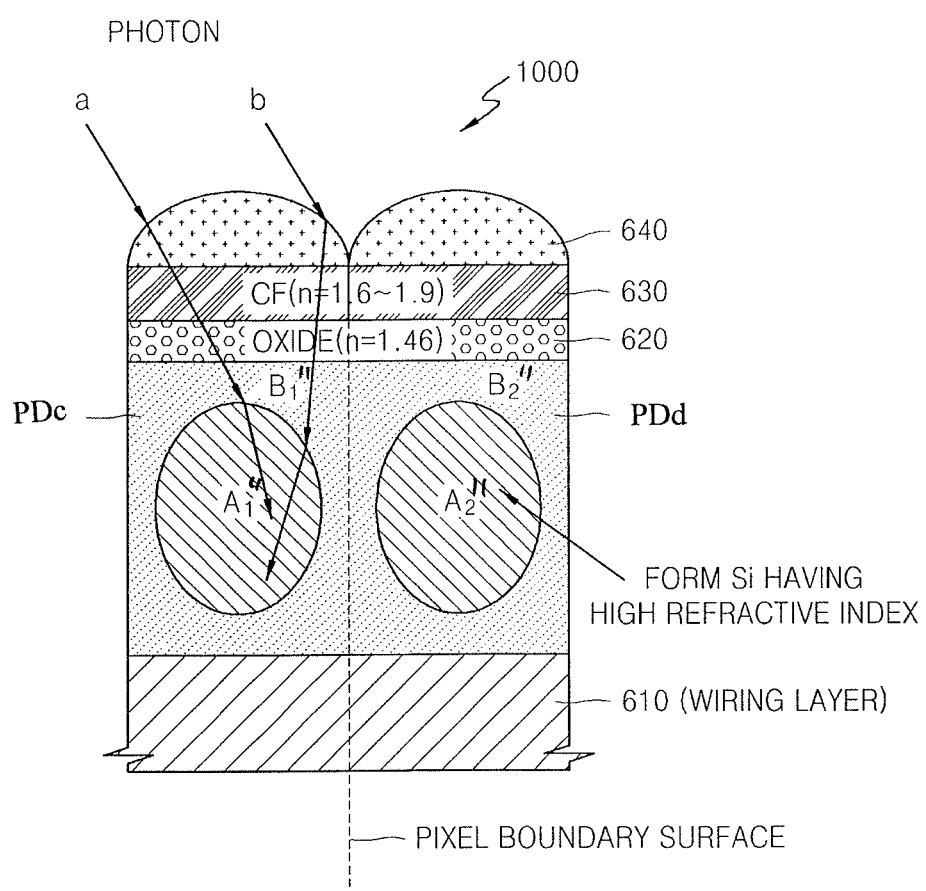
FIG. 9 illustrates a cross-sectional view of a stacked structure of another exemplary embodiment of a back-side illumination CMOS image sensor.
Figure 10:
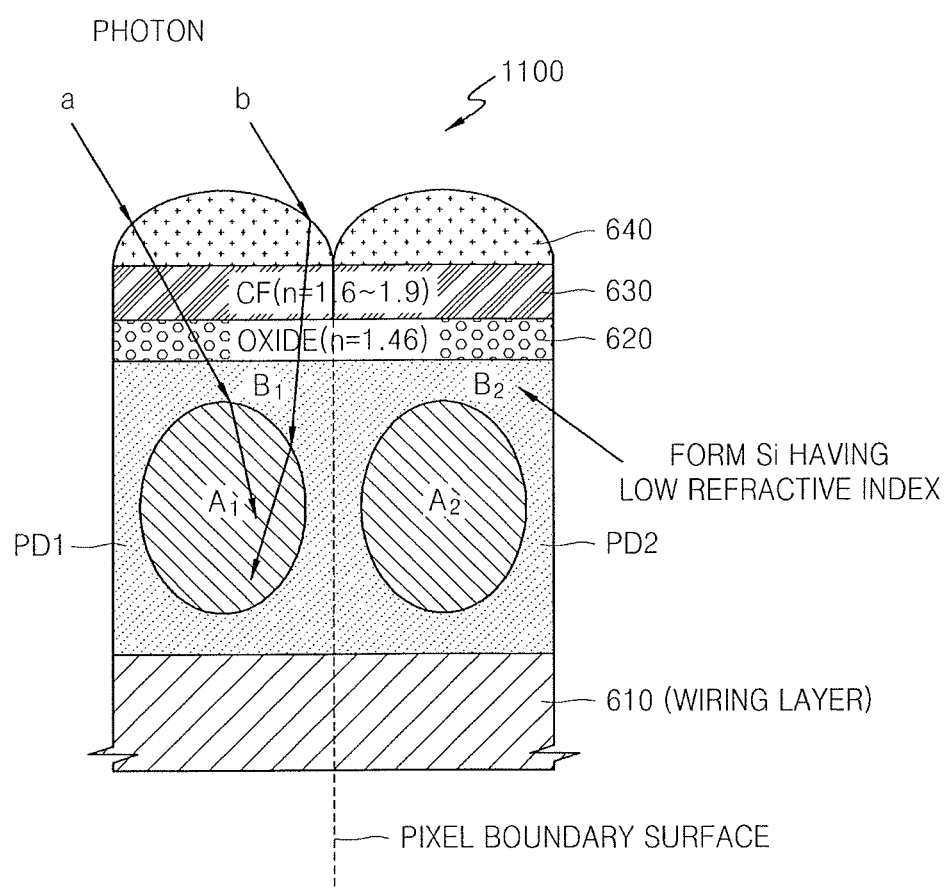
FIG. 10 illustrates a cross-sectional view of a stacked structure of another exemplary embodiment of a back-side illumination CMOS image sensor.

FIGS. 9 and 10 illustrate other exemplary embodiments of cross-sectional views of back-side illumination CMOS image sensors 1000 and 1100. Stacked structures of FIGS. 9 and 10 are the same as the stacked structures of FIGS. 5A and 5B, except that first portions $A_1''$ and $A_2''$ are circular.

A photodiode and MOS transistors are formed on one surface of a wafer through a series of processes, and metals for electrically connecting the photodiode and the MOS transistors are completely formed. It is assumed that a face of the wafer where the photodiode and the MOS transistors are formed is a top face of the wafer. From among a plurality of layers constituting the back-side illumination CMOS image sensors 1000 and 1100 of FIGS. 9 and 10, a layer formed by the aforesaid process is the wired layer 610.

After the aforesaid process is completed, a bottom face of the wafer is ground to a predetermined thickness. When the ground wafer is turned upside down, the substrate located at the bottom is facing upwards. The color filter 630 and the micro-lens 640 are formed on the ground face of the wafer in a subsequent process. An exemplary process of forming each photodiode is described below, but embodiments are not limited thereto.

Referring to FIG. 9, if the first portions $A_1''$ and $A_2''$ of the silicon constituting photodiodes PDc and PDd are formed by doping or compound semiconductor growth to have a high refractive index, light incident into one photodiode, e.g., the photodiode PDc, may be prevented from moving to the neighboring pixel, e.g., the photodiode PDd.

For example, in one or more embodiments, a material constituting the second portions $B_1''$ and $B_2''$ is Si, and a material constituting the first portions $A_1''$ and $A_2''$ may be SiGe. The doping or the compound semiconductor growth is well-known to one of ordinary skill in the art, and thus, a detailed explanation thereof will not be given here. Photons move in the same path as that described with reference to FIGS. 5A and 5B.

A material constituting the second portion $B_1''$ of the photodiode PDc is Si (n=3.5, n is a refractive index) and the first portion $A_1''$ of the photodiode PDc is formed of a material having a refractive index that is higher than that of Si. Also, a refractive index of the color filter 630 may equal to and/or be within a range from about 1.6 to about 1.9, and a refractive index of the insulating layer 620 including oxide may be 1.46.

Accordingly, according to Snell's law, photons "a" and "b" focused by the micro-lens 640 passes through the color filter 630 and the insulating layer 620 and reaches the first portion $A_1''$. Next, when moving from a dense medium to a sparse medium, the photons "a" and "b" are bent to a central portion of the photodiode PDc.

Referring to FIG. 10, if the second portions $B_1$ and $B_2$, which are formed of Si, of the photodiodes PDc and PDd, are formed by doping or compound semiconductor growth to have a low refractive index. In such embodiments, light incident on one photodiode, e.g., the photodiode PD1, may be prevented from moving to a neighboring pixel, e.g., the photodiode PD2. For example, in this case, while a material of the first portions $A_1$ and $A_2$ may be Si, a material of the second portions $B_1$ and $B_2$ may be SiC. Photons move in the same path as that described above, and thus, a repetitive explanation thereof will not be given.

Figure 11:
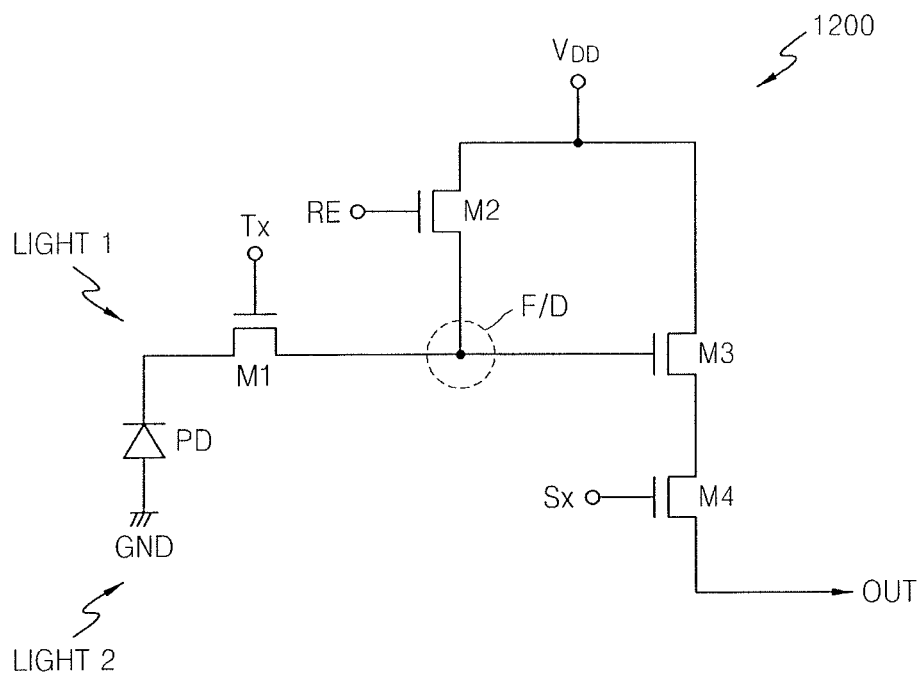
FIG. 11 illustrates a circuit diagram of an exemplary embodiment of a unit pixel of a CMOS image sensor.

FIG. 11 illustrates a circuit diagram of a unit pixel 1200 employable in a CMOS image sensor, e.g., 100, 600a, 600b, 700a, 700b, employing one or more features described herein.

Referring to FIG. 11, the unit pixel 1200 may include a photodiode PD, a transfer transistor M1 for transferring photons focused on the photodiode PD to a floating diffusion region F/D, a reset transistor M2 for resetting the floating diffusion region F/D, a convert transistor M3 for generating an electrical signal corresponding to the photons transferred to the floating diffusion region F/D, and a select transistor M4 for transmitting the electrical signal to an external device.

Operations of the transfer transistor M1, the reset transistor M2, and the select transistor M4 are controlled by a transfer control signal Tx, a reset control signal RE, and a select control signal Sx, respectively. A general front-side illumination CMOS image sensor and a back-side illumination CMOS image sensor may be distinguished from each other according to a direction in which light is received. That is, the general front-side illumination CMOS image sensor receives light LIGHT1 incident on an N-type electrode of the photodiode PD, and the back-side CMOS image sensor receives light LIGHT2 incident on a P-type electrode of the photodiode PD.

In the general front-side illumination CMOS image sensor, light incident on a unit pixel is partially blocked from being incident on the photodiode PD due to MOS transistors. Meanwhile in the back-side illumination CMOS image sensor, since light may be received through the entire unit pixel, light receiving efficiency of the back-side illumination CMOS image sensor is higher than that of the general front-side illumination CMOS image sensor.

Figure 12:
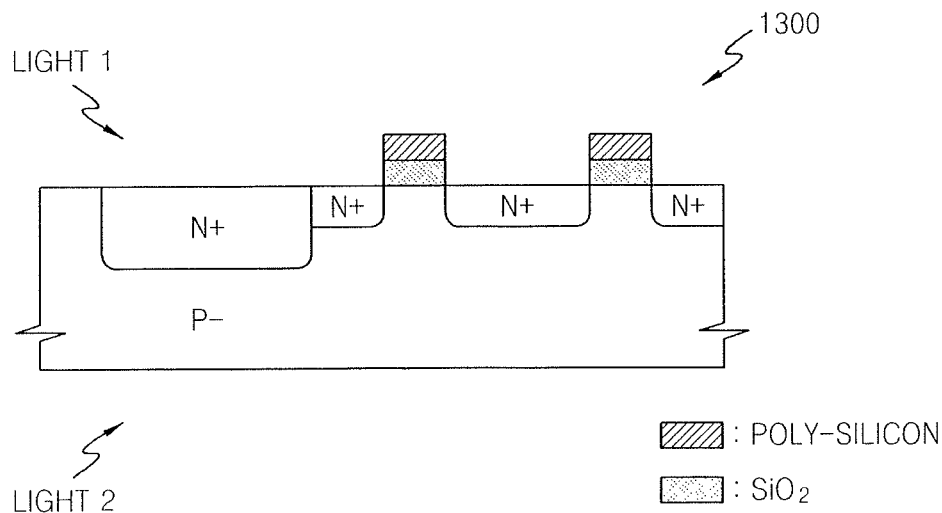
FIG. 12 illustrates a cross-sectional view of an exemplary embodiment of a unit pixel generated using a CMOS process.

FIG. 12 illustrates a cross-sectional view of an exemplary embodiment of a unit pixel 1300 generated by using a CMOS process.

Referring to FIG. 12, the unit pixel 1300 generated using the CMOS process includes a photodiode and a MOS transistor formed on a P-type substrate. A first electrode of the photodiode corresponds to the substrate and a second electrode of the photodiode corresponds to an N+-type diffusion region. The MOS transistor is operated by a signal applied to a gate formed between two N+-type diffusion regions, and the gate includes an oxide film ($SiO_2$) formed on the substrate and polycrystalline silicon (Poly-Silicon) formed on the oxide film.

In this case, it is easily found that the area of the photodiode, which may receive light LIGHT1 when the light LIGHT1 is applied to the N+-type diffusion region of the photodiode is relatively wider than the area of the photodiode, which may receive light LIGHT2 when the light LIGHT2 is applied to the P-type substrate of the photodiode. The inventive concept relates to a back-side illumination CMOS image sensor that receives the light LIGHT2 applied to the P-type substrate of the photodiode.

Figure 13:
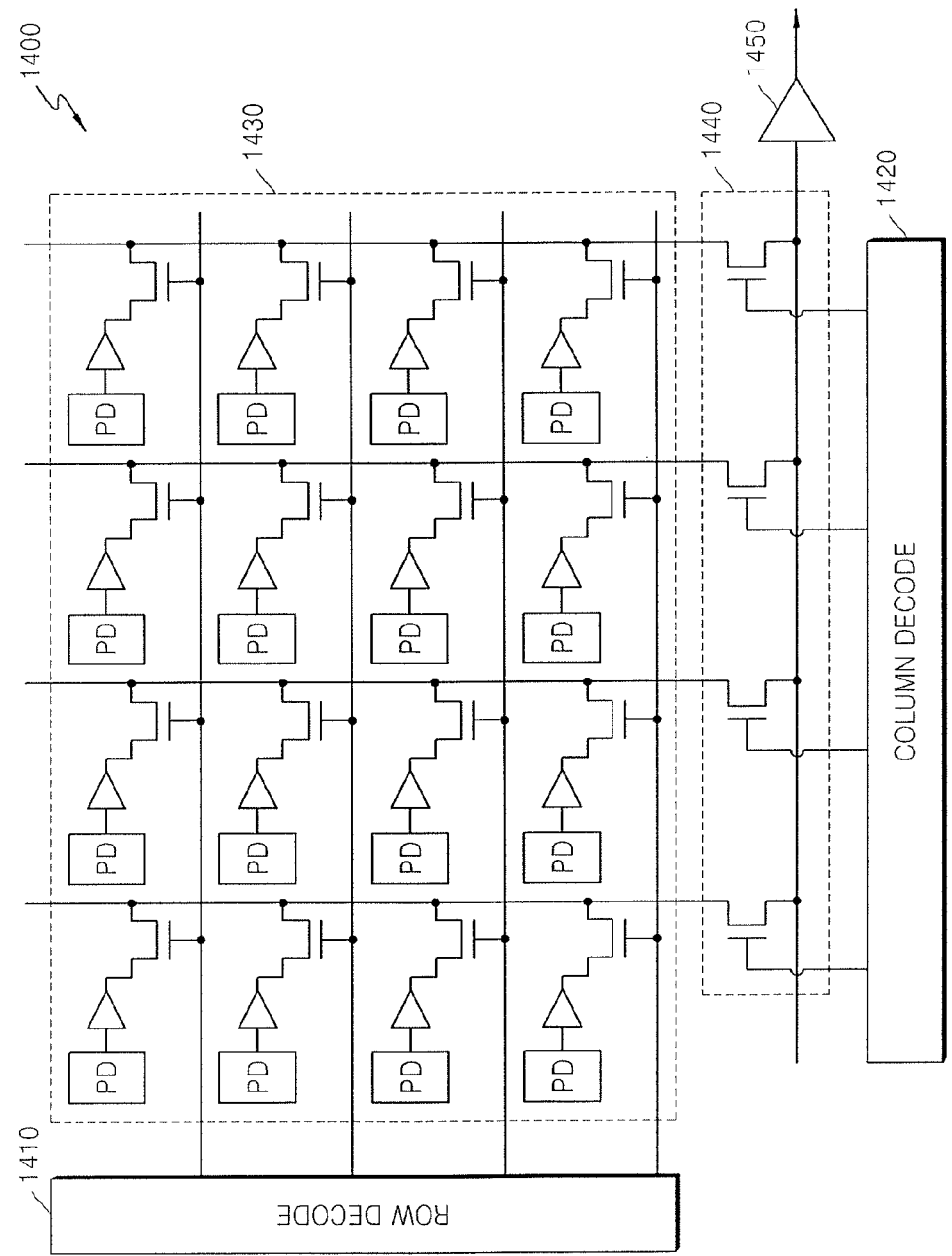
FIG. 13 illustrates a schematic diagram of an exemplary embodiment of a CMOS image sensor.

FIG. 13 illustrates a diagram of an exemplary embodiment of a configuration of a CMOS image sensor 1400.

Referring to FIG. 13, the CMOS image sensor 1400 may include a row decoder 1410, a column decoder 1420, a pixel array 1430, a selecting unit 1440, and a buffer 1450.

A plurality of unit pixels may be arranged two-dimensionally in the pixel array 1430. The row decoder 1410 controls operations of the unit pixels arranged in the pixel array 1430 in units of horizontal lines. The column decoder 1420 controls the selecting unit 1440, and controls operations of the unit pixels arranged in the pixel array 1430 in units of vertical lines. An electrical signal obtained by the pixel array 1430 is output through the buffer 1450.

Each of the unit pixels constituting the pixel array 1430 may be configured as shown, e.g., in FIG. 1, or 5A-6B.

Figure 14:
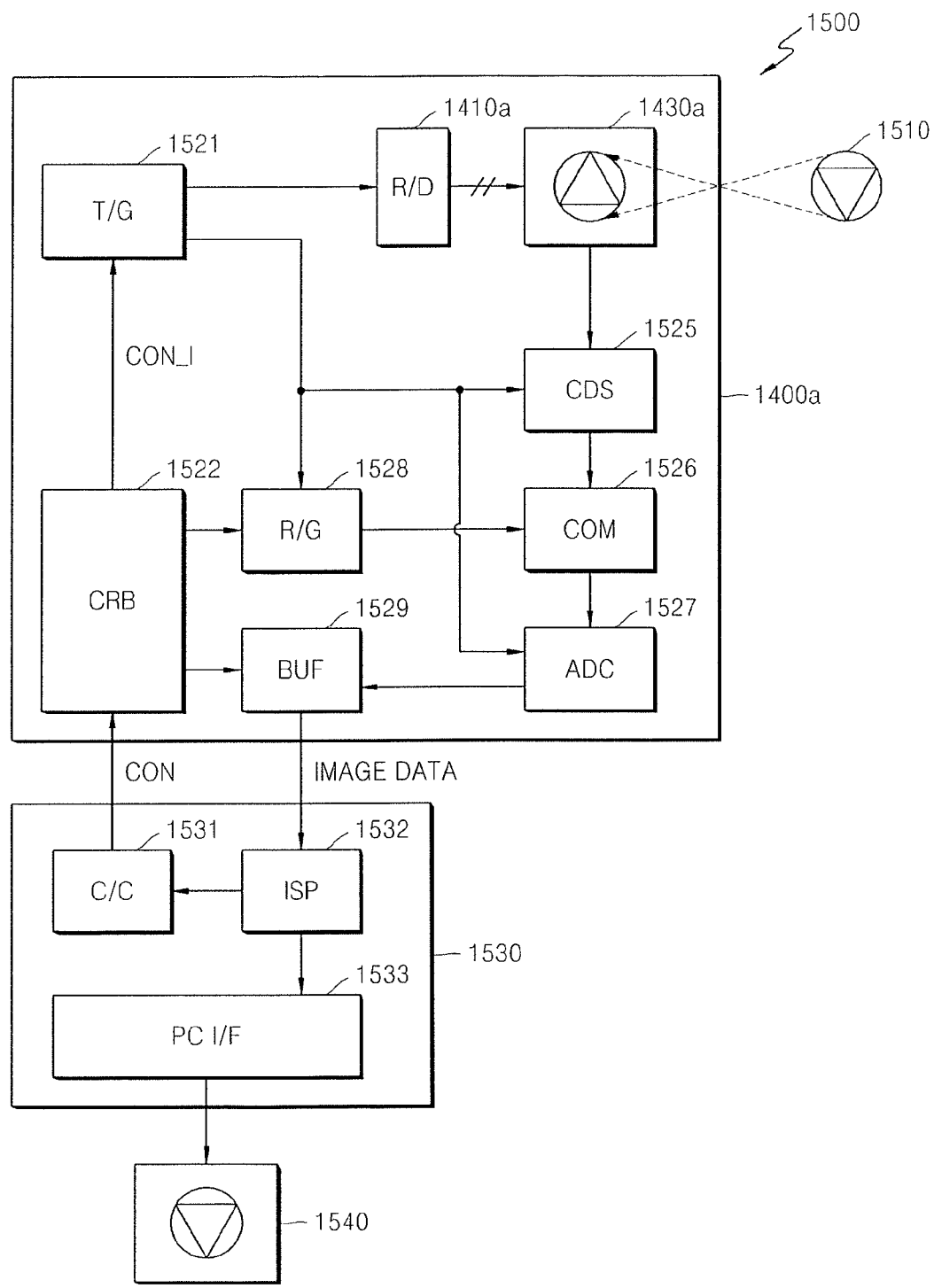
FIG. 14 illustrates a block diagram of an exemplary embodiment of a camera system.

FIG. 14 illustrates a block diagram of an exemplary embodiment of a camera system 1500.

The image sensor according to the inventive concept may also be used in the camera system 1500 of FIG. 14.

Referring to FIG. 14, the camera system 1500 may include an image sensor 1400a, a signal processing block 1530, and a display 1540.

The image sensor 1400a receives an image signal incident from an external object 1510 in response to a control signal CON generated from the signal processing block 1530 and generates image data corresponding to the image signal.

The image sensor 1400a may include a signal generator 1521, a control register block 1522, a row decoder 1410a, a pixel array 1430a, a CDS (correlated Double Sampling) 1525, a comparator 1526, an analog-digital converter 1527, a ramp signal generator 1528, and a buffer 1529.

The signal generator 1521 generates a clock signal for controlling operations of the row decoder 1410a, the ramp signal generator 1528, the CDS 1525, and the analog-digital converter 1527 in response to an internal control signal CON_1 received from the control register bock 1522.

The control register block 1522 generates the internal control signal CON_1 in response to the control signal CON received from the signal processing block 1530, and controls operations of the ramp signal generator 1528 and the buffer 1529.

The row decoder 1410a and the pixel array 1430a may be in the same as the row decoder 1410 and the pixel array 1430 of FIG. 13, and thus an explanation thereof will be given only briefly.

The row decoder 1410a applies a necessary signal to the pixel array 1430a.

The pixel array 1430a generates an electrical signal corresponding to an image signal of the external object 1510 that is externally applied.

The CDS 1525 detects a signal corresponding to a difference between two electrical signals received from each of photodiodes constituting an image sensor array 1224. Although not shown in FIG. 14, the CDS 1525 may include the column decoder 1420, the selecting unit 1440, and the buffer 1450 of FIG. 13.

The comparator 1526 compares the signal detected by the CDS 105 with a predetermined reference signal in response to a ramp signal output from the ramp signal generator 1528 to generate a signal.

The analog-to-digital converter 1527 generates image data that is obtained by converting the signal generated by the comparator 1526 into a digital signal.

The ramp signal generator 1528 generates the ramp signal under the control of the control register block 1522.

The buffer 1529 stores or output the image data output from the analog-digital converter 1527 under the control of the control register block 1522.

The signal processing block 1530 receives and processes the image data output from the buffer 1529 constituting the image sensor 1400a, and transmits the processed image data to the display 1540 to be reproduced. The signal processing block 1530 includes a camera control unit 1531, an image signal processing unit 1532, and a PC interface 1533.

The camera control unit 1531 generates the control signal CON used to control an operation of the image sensor 1400a.

The image signal processing unit 1532 controls an operation of the camera control unit 1531, and receives and processes the image data and transmits the processed image data to the display 1540 through the PC interface 1533.

Figure 15:
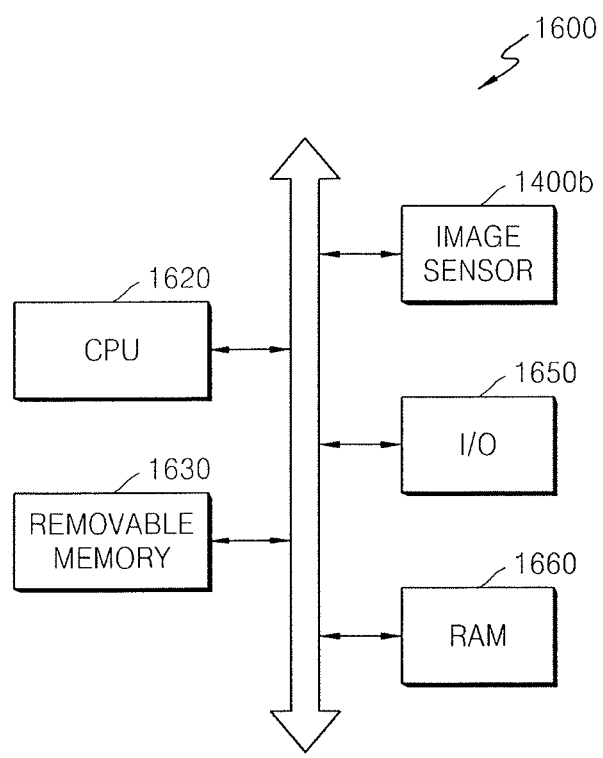
FIG. 15 illustrates a block diagram of an exemplary embodiment of a processor including an image sensor according to an embodiment of the inventive concept.

FIG. 15 illustrates a block diagram of an exemplary embodiment of a processor 1600. Embodiments of an image sensor including one or more features described above may be employed in the processor 1600 of FIG. 15.

Referring to FIG. 15, the processor 1600 may include a central processing unit (CPU) 1620 for transmitting and receiving data through a bus 1610, a memory 1630 that is attachable and detachable, an image sensor 1400b, an input/output unit 1650, and a memory unit 1660. Although the processor 1600 is illustrated in FIG. 15 having a general configuration, embodiments are not limited thereto and the processor may have various other configurations.

In general, a front-side illumination CMOS image sensor receives light through a front surface, a great amount of light is absorbed or lost while passing through a thick interlayer insulating film, and the amount of light collected by a photodiode is small. In particular, if red light having a long wavelength is incident on such a front-side illumination CMOS image sensor, a great amount is lost and the red light is accumulated in a neighboring pixel due to severe refraction while passing through the thick interlayer insulating film, thereby causing optical crosstalk. As a result, back-side illumination CMOS image sensors have been suggested. Back-side illumination CMOS image sensors receive light from a bottom face of a chip, that is, a substrate, instead of from a top face of the chip.

In one or more embodiments of a CMOS image sensor employing one or more features described herein, optical crosstalk is avoided because light having a long wavelength is reflected at a boundary surface between a first portion A1 and a second portion B1 having different refractive indices, and thus fails to move to a neighboring photodiode and thus, does not affect a neighboring photodiode. As described above, a CMOS image sensor employing one or more features described herein may include, e.g., a front-side illumination CMOS image sensor and a back-side illumination CMOS image sensor.

Exemplary embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A back-side illumination complementary metal-oxide-semiconductor (CMOS) image sensor, comprising:
   a wiring layer, the wiring layer including a plurality of metal layers and insulating layers for insulating the plurality of metal layers;
   a photodiode on the wiring layer;
   an anti-absorption layer on the photodiode; and
   an anti-reflection layer on the anti-absorption layer,
   wherein the anti-absorption layer includes a compound semiconductor having an energy band gap greater than an energy band gap of a semiconductor included in the photodiode.

2. The CMOS image sensor as claimed in claim 1, wherein the compound semiconductor passes visible light therethrough.

3. The CMOS image sensor as claimed in claim 1, wherein the semiconductor includes silicon (Si).

4. The CMOS image sensor as claimed in claim 1, wherein the compound semiconductor is silicon-carbide (SiC).

5. The CMOS image sensor as claimed in claim 1, wherein the compound semiconductor is formed on the photodiode by deposition.

6. The CMOS image sensor as claimed in claim 1, wherein a P-type dopant with high concentration is doped into the anti-absorption layer.

7. The CMOS image sensor as claimed in claim 6, wherein the P-type dopant includes boron (B).

8. The CMOS image sensor as claimed in claim 1, further comprising a color filter layer formed on the anti-reflection layer.

9. The CMOS image sensor as claimed in claim 8, further comprising a micro-lens formed on the color filter layer.

10. A complementary metal-oxide-semiconductor (CMOS) image sensor, comprising:
- a micro-lens for receiving light; and
- a photodiode including a first portion and a second portion, wherein light is focused on the first portion by the micro-lens and the second portion at least partially surrounds the first portion,
- a material of the first portion has a refractive index higher than a refractive index of a material of the second portion, and either
- the material of the first portion includes silicon-germanium (SiGe) and the material of the second portion includes silicon (Si),
- or
- the material of the first portion includes silicon (Si) and the material of the second portion includes silicon-carbide (SiC).

11. The CMOS image sensor as claimed in claim 10, wherein the light focused on the first portion is totally reflected at a boundary surface between the first portion and the second portion.

12. The CMOS image sensor as claimed in claim 10, wherein the photodiode includes silicon (Si), and
wherein the material of the first portion has a refractive index higher than a refractive index of the silicon (Si) due to doping or compound semiconductor growth.

13. The CMOS image sensor as claimed in claim 10, wherein the photodiode includes silicon (Si), and
wherein the material of the second portion has a refractive index lower than a refractive index of the silicon due to doping or compound semiconductor growth.

14. The CMOS image sensor as claimed in claim 10, wherein the first portion is formed at a central portion of the photodiode, and the second portion is formed to surround an upper surface, a lower surface, and side surfaces of the first portion.

15. The CMOS image sensor as claimed in claim 10, wherein the first portion is formed to pass through the photodiode in a Z-axis direction and the second portion is formed to surround side surfaces of the first portion.

16. The CMOS image sensor as claimed in claim 10, wherein the CMOS image sensor is one of a back-side illumination CMOS image sensor and a front-side illumination CMOS image sensor.

17. A complementary metal-oxide-semiconductor (CMOS) image sensor, comprising:
- a wiring layer;
- a photodiode stacked with the wiring layer, the photodiode including a first portion and a second portion;
- a micro-lens stacked on the photodiode;
- an anti-reflection layer stacked on the photodiode; and
- anti-absorption layer between the photodiode and the anti-reflection layer;
- wherein:
- light is focused on the first portion by the micro-lens and the second portion at least partially surrounds the first portion,
- a material of the first portion has a refractive index higher than a refractive index of a material of the second portion, and
- the anti-absorption layer includes a compound semiconductor having an energy band gap greater than an energy band gap of a semiconductor included in the photodiode.